United States Patent [19]

Mizuno et al.

[11] Patent Number: 5,728,629
[45] Date of Patent: Mar. 17, 1998

[54] PROCESS FOR PREVENTING DEPOSITION ON INNER SURFACES OF CVD REACTOR

[75] Inventors: Shigeru Mizuno; Takanori Yoshimura; Yoshihiro Katsumata; Nobuyoki Takahashi, all of Tokyo, Japan

[73] Assignee: Anelva Corporation, Fuchu, Japan

[21] Appl. No.: 311,681

[22] Filed: Sep. 23, 1994

[30] Foreign Application Priority Data

Nov. 29, 1993 [JP] Japan ..................................... 5-323196

[51] Int. Cl.⁶ ................................................. H01L 21/285
[52] U.S. Cl. .......................... 438/680; 438/683; 438/685; 438/687; 438/905; 438/958; 427/248.1
[58] Field of Search ................................ 437/225, 192, 437/245; 427/248.1; 438/680, 683, 905, 687, 958; 148/27

[56] References Cited

U.S. PATENT DOCUMENTS

| | | | |
|---|---|---|---|
| 4,510,172 | 4/1985 | Ray | 437/239 |
| 4,737,474 | 4/1988 | Price et al. | 437/200 |
| 4,851,295 | 7/1989 | Brors | 428/450 |
| 5,129,958 | 7/1992 | Nagashima et al. | 134/22.1 |
| 5,158,644 | 10/1992 | Cheung et al. | 156/643 |
| 5,207,836 | 5/1993 | Chang | 134/1 |
| 5,326,723 | 7/1994 | Petro et al. | 437/192 |
| 5,395,796 | 3/1995 | Haskell et al. | 437/195 |
| 5,434,109 | 7/1995 | Geissler et al. | 437/239 |
| 5,510,297 | 4/1996 | Telford et al. | 437/245 |
| 5,565,382 | 10/1996 | Tseng et al. | 437/245 |

FOREIGN PATENT DOCUMENTS

| | | |
|---|---|---|
| 4-345024 | 12/1992 | Japan . |
| 5-226270 | 9/1993 | Japan . |

OTHER PUBLICATIONS

*Webster'S II New Riverside University Dictionary*, Riverside Publishing, 1984, p. 80.
Bryant, W.A., Kinetics of Tungsten Deposition by the Reaction of $WF_6$ and Hydrogen, J. Electrochem. Soc.: Solid-State Science and Technology, Sep. 1978, pp. 1534-1543.

*Primary Examiner*—Charles L. Bowers, Jr.
*Assistant Examiner*—Matthew Whipple
*Attorney, Agent, or Firm*—Burns, Doane, Swecker & Mathis, LLP

[57] ABSTRACT

A process for forming a thin film by chemical vapor deposition which comprises repeating a substrate processing step on one or more substrates placed inside a reaction chamber by introducing a reaction gas inside the reaction chamber. The process includes a step of introducing a passivation gas or the like for passivating the surface of a thin film deposited on the fixing jig or other peripheral members between substrate processing steps. The passivation gas is, for example, an adsorbent gas or an oxidizing gas. More specifically, an example of an adsorbent gas is a mixture of an inert gas and from 0.1 to 10% of $NH_3$ gas or $SiH_2Cl_2$ gas, and an example of an oxidizing gas is a mixture of an inert gas and at least one selected from the group of oxygen, nitrogen, monoxide, and nitrogen dioxide. The inert gas may also be replaced with $N_2$ gas.

10 Claims, 8 Drawing Sheets

PROCESS FOR PREVENTING DEPOSITION ON INNER SURFACES OF CVD REACTOR

BACKGROUND OF THE INVENTION

1. Field of the Invention

The present invention relates to a process for forming a thin film of, for example, tungsten, copper, titanium nitride, or titanium, on a substrate by chemical vapor deposition.

2. Description of Related Art

The state of the art for fabricating semiconductor devices has been changing with the increasing integration density of semiconductor elements. For instance, a metallic film for use as an interconnection, e.g., an Al film, has been formed heretofore by the method of sputtering. However, as the aspect ratio (the ratio of the hole depth to the hole diameter) increases to exceed 1 due to a decrease in hole diameter, it has become very difficult to form a film having an acceptable step coverage by the method of sputtering. The interconnection patterned in films deposited by sputtering is likely to become disconnected at the bottom corner of the hole portions. Accordingly, the use of the method of sputtering can no longer provide reliable semiconductor elements.

Recently, great attention has been paid to a process for forming a film on fine holes, which comprises depositing a thin film of tungsten (W) by a chemical vapor deposition (CVD) method. The CVD process enables the forming of a thin film with excellent step coverage even on fine holes with an integration density of 16 Mb or higher. More specifically, the CVD process provides a thin film which uniformly covers holes having aspect ratios of 2 or more. As a result, a highly reliable device having an integration density of 16 Mb or higher can be produced.

FIG. 3 shows a conventional apparatus for forming tungsten films by a chemical vapor deposition method. The CVD apparatus comprises a reaction chamber 101 which is evacuated by means of a vacuum pump (not shown in the figure) to reduce the inner pressure. A substrate 103 is mounted on a substrate holder 102 placed inside the reaction chamber. The substrate is fixed to the substrate holder with fixing jig 106. The substrate holder receives radiant heat given off from a heating lamp 105 through an airtight quartz window 104 provided on a lower wall of the reaction chamber. The radiant heat is supplied to the substrate by conduction through the substrate holder. Heating of the substrate can be controlled by measuring the temperature of the substrate holder by means of a thermocouple 107. The signal from the thermocouple is fed back to the control system (not shown) of the heating lamp. A path 110 is formed inside each of the fixing jig 106 and the fixing jig support portions 108. A cooling medium is made to flow through the path 110 to suppress the adhesion of unwanted film onto the surface of the fixing jig. The temperature of the cooling medium is maintained below a temperature at which tungsten film formation occurs.

The reactive gas is supplied by a gas supply portion 111 which faces toward the substrate and introduces gas inside the reaction chamber. A desired film is formed on the surface of the substrate by a chemical vapor deposition method. The starting material gas remaining unreacted after the reaction and the gaseous by-products of the reaction are evacuated through an evacuation piping 112.

In the case when multiple substrates are processed by the CVD method, there are two possible methods: a single wafer processing method and a batch processing method. The single wafer processing method comprises forming a film continuously on one sheet after another in a reaction chamber. The batch processing method comprises forming a film on a plurality of substrates at one time in a reaction chamber. Regardless of the processing method, the conditions for every processing, including the gas flow rate, the pressure, and the temperature during the process are kept constant throughout the process. Usual processing conditions for both methods are, for example, gas flow rates of 300 to 1,000 sccm (standard cubic centimeters per minute), pressures of from 30 to 100 Torr and substrate temperatures in the range of from 400° to 500° C. The film formation conditions, however, depend on the use of the film. For example, to form a film with which to fill a hole, a substrate temperature is set to as low as about 400° C. while also lowering the ratio of gas flow rates of $H_2/WF_6$. To form a film as an interconnection, the gas flow rates of $H_2/WF_6$ are increased and the substrate temperature is set as high as possible to reduce inner stress in the deposited film. Generally, a film formation process requires a nuclei formation step before depositing a film. Conditions for the nuclei formation are the supply of $WF_6$ gas at a flow rate of from 5 to 10 sccm, $SiH_4$ gas at a flow rate of from 1 to 4 sccm, a pressure in the range of from 0.1 to 5 Torr and a substrate temperature in the range of from 400° to 500° C.

In either the single wafer processing or the batch processing, the film formation process is repeated. However, with increasing number of film formations, it has been found that the uniform distribution in sheet resistance tends to become increasingly impaired. FIG. 4 shows the change in the deviation in sheet resistance with increasing number of the substrates processed in the case of a continuous process of film formation using a conventional single wafer processing CVD apparatus. The term "deviation in sheet resistance" as referred to herein means the deviation in the value of the sheet resistance uniformity of the deposited films, expressed by:

$$\frac{\text{standard deviation}}{\text{average resistance}} \times 100 = \frac{\sigma}{\overline{X}} \times 100$$

The increase in the average value of the sheet resistance and the undesired deviation in sheet resistance are due to the increase in the sheet resistance at the outer peripheral portions of the substrate. The increase in sheet resistance at the outer peripheral portions shows that the film is thinner at these portions as compared with the film in the other portions. A nonuniform thickness results from the lower rate of film deposition at the peripheral portions as compared to the film deposition rate at the other portions.

The present inventors have found that the lowering in film deposition rate at these portions occurs due to the presence of a tungsten film that is adhered to the fixing jig. In further detail, it has been found that the deviation in deposited film is further enhanced as the area and thickness of the tungsten film adhered to the fixing jig increases.

More specifically, tungsten film begins to adhere to the portions of the fixing jig, which are close to the substrate and which are at a temperature close to the temperature of the substrate. The area of adhesion expands from an initial point of adhesion as the number of processed substrates (number of process times) increases. FIG. 4 shows that, in a single wafer processing system under the standard film formation conditions in which up to about 50 substrate sheets are processed, the deviation in sheet resistance or uniformity remains in the range of from 2 to 3%. However, even in this limited range of within 2 to 3%, the deviation in sheet resistance becomes certainly larger with the increasing number of processed substrates. The area of the adhered tungsten after processing 50 sheets extends outward in the radial direction from the inner edge of the fixing jig to about 15 mm. After processing 100 sheets, however, the area of tungsten film is found to extend in the radial direction out to about 30 mm.

As the number of the processed substrates increases, the area of the adhered tungsten is extended two-dimensionally towards the outer periphery of the fixing jig, while the thickness of the tungsten film also increases. However, no film deposition occurs at the portion of the fixing jig having a temperature greatly different from that of the substrate. Thus, the area of film adhesion on the fixing jig tends to be limited. Another reason why the uniform distribution of the sheet resistance is impaired is that with an increase in the thickness of the deposited film adhering to the fixing jig the surface of the film tends to become more uneven, containing many depressions and protrusions. Therefore, the surface area of a thick film is essentially large. Thus, the increase in film thickness corresponds to an increase in the surface area of the deposited film.

Similar to FIG. 4, FIG. 5 shows the deviation in sheet resistance with the increasing number of the processed substrates for which conditions are the same as in FIG. 4. In this case, however, air is introduced into the reaction chamber between the film formation processes. It can be seen that the deviation in sheet resistance is ameliorated by the introduction of air, in the actual process according to FIG. 5. After processing, 600 substrates in total air was introduced. Then 50-sheet lots were continuously processed, and air was introduced after every 25 processed substrates at a pressure of 40 Torr and for a duration of 5 minutes. More specifically, air was introduced between the 25th substrate and the 26th substrate. As a result of the above-described experimentation, the deviation was found to yield an improved value of 1.5% as compared with the value of 4.5% of prior to the introduction of air. The result shown in FIG. 5 is a consequence of the surface passivation of the tungsten film adhering to the fixing jig. The active surface of the tungsten film is oxidized by the introduction of air. The film growth reaction can therefore be suppressed by passivating the active surface of the tungsten film.

The active surface of the tungsten film adhering to the fixing jig lowers the film deposition rate on the substrate in the vicinity of the fixing jig, and thereby increases the deviation in sheet resistance. The reason for this phenomena may be explained by either the suppression of the film growth reaction which occurs as a consequence of the increase in reaction by-products, or by the insufficient supply of reaction gas in the vicinity of the fixing jig, or particularly, by the lack of $WF_6$ gas which occurs as a result of $WF_6$ consumed due to tungsten film adhering to the fixing jig. The film growth reaction is accelerated by the increase in the surface area of the adhered film; more specifically, by the increase in both the area of film deposition and the film thickness. Accelerating the film growth reaction on the adhered film leads to an increase in the amount of the reaction by-products and to an insufficient supply of reaction gas on the portions of the substrates in the vicinity of the fixing jig.

Conventionally, the problem of tungsten film adhered during the film formation process has been dealt with by simply removing it. Prior art processes for removing the adhered tungsten film include cleaning by means of RIE (Reactive Ion Etching), using a plasma after effecting the film deposition (as disclosed in U.S. Pat. No. 5,158,644) and chemical etching using a strongly reactive gas (as disclosed in JP-A-5-226270). The cleaning process using RIE etching, however, takes a long time in total because the RIE etching process is performed on each substrate, which results in a considerably low output. The cleaning process using chemical etching requires the treatment of the etching gas and the by-product gas. Accordingly, the chemical etching process is quite expensive because it requires the establishment of an installation for treating the waste gas.

An alternative process may be one using no fixing jigs. However, if the substrate is mounted loosely to the substrate holder, a gap may form between the substrate and the substrate holder due to the flexure of the substrate. This leads to a nonuniform heat conduction and to the increase in the deviation of the sheet resistance to unacceptable levels. Thus, it is practically impossible not to use the fixing jigs in the film formation process. Another problem with using no fixing jigs is that an oxide film ($SiO_2$ film) which is poorly stuck to the tungsten film is exposed at the outermost periphery of the substrate. The tungsten film adhered to the outermost periphery (on the $SiO_2$ film) easily peels off from the substrate becoming dust particles. These dust particles are the severest cause of lowering the yield in the fabrication of semiconductors.

The problem of impairment of the sheet resistance uniformity due to the presence of a film adhering to the fixing jig and the like is found not only in the case of the deposition of tungsten films, but also in the chemical vapor deposition of titanium nitride, titanium, tungsten silicide, titanium silicide, or copper.

OBJECTS AND SUMMARY

In the light of the aforementioned circumstances, an object of the present invention is to provide a process for depositing, with high productivity and excellent reproducibility of sheet resistance, thin films having a good sheet resistance uniformity.

The process for forming a thin film according to the present invention comprises repeatedly conducting a substrate processing step which comprises transferring one or more substrates into a reaction chamber, introducing a reactive gas inside the reaction chamber, forming a film on the substrate by a chemical vapor deposition reaction, and taking the processed substrate from the reaction chamber, wherein a passivation gas is introduced between the substrate processing steps in order to passivate the surface of the thin film deposited on the peripheral member near the substrate. The phrases "to passivate" or "passivation" as referred to herein means rendering inactive the active clean (or pure) surface of a thin film. To passivate the active surface, there are two methods: a method for adsorbing gas molecules to the active surface and a method for oxidizing the active surface by an oxidation reaction. By these methods the active surface of the thin film becomes inactive and the film growth reaction on the surface of the unwanted film can be suppressed by thus inactivating the surface of the thin film. In short, the unwanted film can be prevented from being thickened by passivating the surface of the film. The peripheral members on which unwanted film may be deposited may be, for example, a fixing jig for fixing the substrate and a guide member for guiding the gas upward from the lower portion into the vicinity of the substrate edge.

Most preferably, the passivation gas is introduced every time after the processing of a substrate is completed. Otherwise, the passivation gas is introduced before the deviation in sheet resistance or uniformity attains 3%. The deviation in sheet resistance of 3% is the maximum allowable quality limit from a practical quality control standpoint. FIG. 5 shows that when the substrate is processed one sheet after another, the passivation gas is preferably introduced prior to the continuous processing of five substrates at which time the uniformity exceeds 3%.

In a first embodiment the passivation gas is preferably adsorbate gas which is capable of being adsorbed by the surface of the unwanted film. The adsorbate gas is preferably a mixture comprising an inert gas and from 0.1 to 10% of $NH_3$ (ammonia) gas or a mixture comprising an inert gas and from 0.1 to 10% of gaseous $SiH_2Cl_2$ (dichlorosilane) gas. The inert gas is one selected from a group consisting of Ar (argon), He (helium), Xe (xenon), and Kr (krypton).

In a second embodiment the passivation gas is preferably a gaseous oxidizing agent capable of oxidizing the surface of the unwanted film. The oxidizing gas is preferably a mixture comprising an inert gas and at least one selected from a group consisting of air, oxygen, NO (nitrogen monoxide), and $NO_2$ (nitrogen dioxide). The pressure of the passivation gas is preferably controlled to fall in the range of from 0.1 Torr to several hundreds of Torrs.

In both of the aforementioned processes, $N_2$ (nitrogen) gas can be used as an alternative for the inert gas. It is also preferred that a plasma discharge inside the reaction chamber be generated simultaneously with the introduction of the passivation gas.

The apparatus for forming a thin film for use in the present invention, must be designed such that it is suitable for performing the aforementioned processes for forming a thin film. Preferably, the apparatus comprises a reaction chamber which is kept at a reduced pressure during the processing of the substrates, a substrate support placed inside the reaction chamber, an airtight quartz window provided on the reaction chamber, a heater for supplying heat to the substrate support through the quartz window, a gas supply portion for supplying the reaction gas, an evacuation portion for evacuating the unreacted gas and the by-product gas, and a gas inlet portion for introducing a passivation gas into the reaction chamber to passivate the surface of the thin film deposited on the peripheral members. The passivation gas to be used in the present apparatus may be any of the various types of gases listed above. If the passivation gas is a mixed gas, an additional mechanism for the mixing of the gases is provided.

The passivation gas is introduced from the gas inlet into the reaction chamber at the optimal timing to realize the optimal distribution of sheet resistance. Most preferably, the passivation gas is introduced between each of the substrate processing steps. The passivation gas is introduced from the gas inlet into the reaction chamber by operating a valve which is controlled by a control means. In cases where a mixed gas is used for the passivation gas, the ratio of the gases to be mixed, the pressure at which the mixed gas is introduced, and other conditions are set by a control means.

DETAILED DESCRIPTION OF THE PREFERRED EMBODIMENTS OF THE INVENTION

Figure 1:
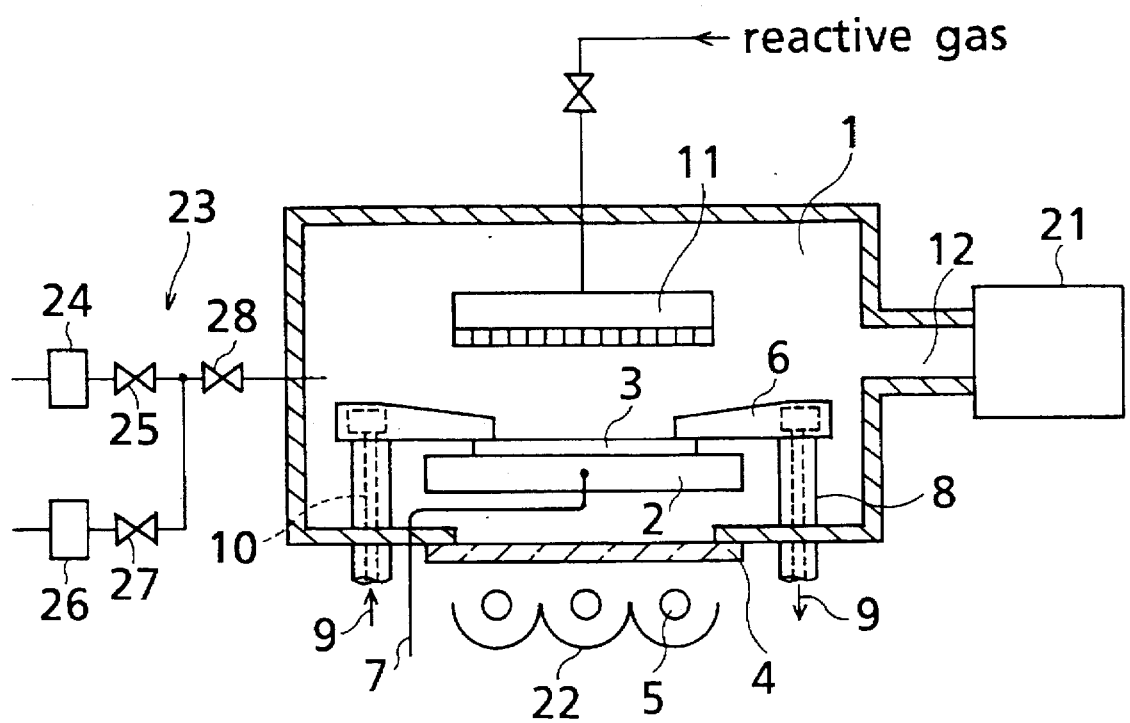
FIG. 1 is a schematically drawn, cross-sectional view, of the essential structure of an apparatus for forming a thin film according to the present invention.

The process for forming a thin film according to the present invention comprises repeatedly conducting the substrate processing step which comprises forming a thin film, e.g., a tungsten (W) film, by chemical vapor deposition. Reactive gas is introduced into a reactive chamber 1 of a CVD apparatus. One or more substrates 1 are fixed therein to a substrate support 2 by using a fixing jig 6. The processed substrates are then taken from the reaction chamber 1. In a preferred process, a step for passivating the surface of an unwanted tungsten film adhering to the peripheral members (such as the jigs 6) by adsorbing a gas thereto or by oxidizing, is incorporated between the substrate processing steps. The passivation gas to be introduced for passivating the unwanted tungsten film is preferably a mixture which comprises an adsorbate gas or an oxidizing gas which functions as an oxidizing agent. By introducing such a mixture, the following phenomenon is observed between the adsorbate gas (oxidizing gas) and the tungsten film.

For instance in a first embodiment of the process, when a mixture comprising an inert gas and from 0.1 to 10% of either $NH_3$ gas or $SiH_2Cl_2$ gas is introduced into the reactive chamber 1, the $NH_3$ gas or $SiH_2Cl_2$ gas is easily adsorbed by the tungsten film deposited on the substrate fixing jig. Then, in the next substrate processing step, the deposition of the tungsten film onto the substrate fixing jig is observed to be considerably suppressed as compared with the previous steps. This phenomena may be explained as follows.

When a tungsten film is deposited by chemical vapor deposition using, e.g., $H_2$ gas and $WF_6$ gas as the starting materials, it is well recognized that the adsorption-desorption step of $H_2$ is the rate determining step of the film deposition reaction (see *Kinetics of Tungsten Deposition by the Reaction of $WF_6$ and Hydrogen*, pp. 1534–1543, SOLID-STATE *SCIENCE AND TECHNOLOGY, J. Electrochem. Soc.*). In particular, the fresh tungsten film deposited under vacuum is clean, and is thereby extremely active. Thus, the gas molecules, i.e., the $H_2$ molecules and the $WF_6$ molecules that flow toward the active sites are readily adsorbed by the surface. This results in acceleration of the deposition reaction of the tungsten film. When the readily adsorbable $NH_3$ or $SiH_2Cl_2$ is introduced, however, it is immediately adsorbed by the active surface of the tungsten film deposited on the fixing jigs. In the next substrate processing step, the adsorption of the $H_2$ and $WF_6$ gases to the tungsten film adhering to the fixing jig is thus inhibited by the previously adsorbed $NH_3$ or $SiH_2Cl_2$. The generation of by-products and the consumption of the reactive gas through the film deposition reaction on the fixing jig is thereby suppressed.

As compared to the prior art processes, the quantity of the tungsten film which is adhered to the fixing jig can be considerably reduced by introducing $NH_3$ gas or $SiH_2Cl_2$ gas upon the completion of the film formation process. In practice, however, the deposition of the new tungsten film on the old tungsten film adhering to the fixing jig begins again after conducting the substrate processing several times. Even if $NH_3$ molecules or $SiH_2Cl_2$ molecules are adsorbed by the clean surface of the tungsten film, it is still impossible to completely cover the clean surface. Thus, it is most preferable to introduce the $NH_3$ gas or the $SiH_2Cl_2$ gas into the reaction chamber every time the substrate processing is completed. Tungsten film can thereby be prevented from adhering to the fixing jig even after the next substrate processing is completed. By introducing the adsorbate gas after each completion of the substrate processing, the deviation in sheet resistance can be kept at approximately 3% or lower. Otherwise, the passivation gas may be introduced before the deviation in sheet resistance reaches 3%. Alternatively, the passivation gas may be introduced before the number of processed substrates reaches five in a single wafer processing, e.g., after four substrates.

According to a second embodiment of the present invention, a mixture comprising an oxidizing agent for a tungsten gas oxidizes the surface of the tungsten film adhered to the fixing jig. The tungsten film is rendered inactive by the oxidation reaction. The distribution of sheet resistance cannot be impaired by the oxidized tungsten film adhered to the fixing jig. The clean surface of the tungsten film on the fixing jig will reduce and even eliminate the deposition of film in the next step.

However, a new tungsten film begins to adhere on the oxidized tungsten film adhered to the fixing jig after conducting the substrate processing several times. In fact, the surface of the tungsten film cannot be oxidized completely. Thus, it is most preferable to introduce the mixture containing an oxidizing gas which functions as the oxidizing agent into the reaction chamber every time the film deposition is completed. Otherwise, a passivation gas may be introduced before the deviation in sheet resistance reaches 3%. Alternatively, the passivation gas may be introduced before five substrates have been processed.

Similarly, the passivation of the film surface can be applied to the process of forming thin films by chemical vapor deposition. More specifically, the passivation based on adsorption (or oxidation) can be applied to the films of, for example, titanium nitride, titanium, tungsten silicide, titanium silicide, and copper. The passivation above is widely applicable because the adsorption step of a reactive gas plays an important role in the film deposition reaction. As is the case in the example above for depositing a tungsten film from $H_2$ and $WF_6$ gases, the adsorption step is particularly important for processes in which the adsorption step is the rate-determining step of the reaction. To suppress the film deposition reaction on the fixing jig by taking advantage of the adsorption action or the oxidation action, a gas which exerts adsorption or oxidation onto each of the thin films must be used.

The present invention is illustrated in greater detail referring to the nonlimiting examples below and to the attached figures. It should be understood, however, that the present invention is not to be construed as being limited thereto.

Example

Referring to FIG. 1, the CVD apparatus used in the process according to the present invention is described below. The CVD apparatus in FIG. 1 comprises a reaction chamber 1 equipped with an evacuation system 21 having a vacuum pump (not shown). The inner pressure of the chamber 1 is reduced by the evacuation system 21. A substrate 3 is mounted on a substrate holder 2, and is fixed thereto by a fixing jig 6, e.g., a ring-shaped fixing jig, which presses the substrate at the edges from the upper side thereof against the substrate holder 2. The CVD apparatus for use in the present invention is referred to only briefly to show the structural elements necessary for carrying out the process. The details of the structure of a CVD apparatus are described in U.S. Pat. No. 5,534,072, issued Jul. 9, 1996, the subject matter of which is incorporated herein by reference.

A quartz window 4 is made airtight to the wall of the reaction chamber. A lamp 5 having a reflector plate 22 on the back is placed on the back side of the quartz window 4, on the outside of the reaction chamber 1. The radiant heat given off from the lamp 5 is transmitted through the quartz window 4 to heat the substrate holder 2. The substrate 3 is then heated by the conduction of the heat from the substrate holder 2. The temperature of the substrate holder 2 is measured by a thermocouple 7, and a signal according to the measurement from the thermocouple 7 is fed back to a lamp controller (not shown in the figure). The temperature of the substrate holder 2 is set to a predetermined temperature by the lamp controller.

A gas supply portion 11 is placed facing the substrate 3 to supply the reactive gas to the reaction chamber 1. The reactive gas supplied by the gas supply portion 11 includes, for example, a starting material gas for forming a tungsten film on the surface of the substrate 3, and a reducing gas. More specifically, the starting material gas is preferably $WF_6$ gas, and the reducing gas is preferably either $H_2$ gas or $SiH_4$ gas. The components of the reactive gases differ depending on the kind of film to be deposited on the substrate 3. The unreacted gas or the gaseous byproducts which are generated during the film deposition process are evacuated through an evacuation path 12. The film formation processing step includes the steps of supplying the reactive gas and of evacuating the unreacted gases and the like.

A path 10 for a cooling medium, e.g., water, is formed inside the fixing jig 6 and the fixing jig support 8. With this particular structure, the temperature of the fixing jig is kept constant and the area of unwanted tungsten film deposition on the fixing jig 6 can be confined to a region located in the vicinity of the substrate. In case of the deposition of a tungsten film, the temperature of the cooling medium is preferably kept within a range of from 50° to 85° C.

As described in the foregoing, the substrates in the CVD apparatus above are processed one after another. More specifically, a substrate 3 is transferred to the reaction chamber 1 and subjected to film formation processing. Upon completion of the film formation, the substrate 3 is taken from the reaction chamber 1. The substrate processing step comprised of a substrate transfer step, a film formation step, and a substrate removal step is repeated on a single substrate. In a CVD apparatus of the batch type, the substrate processing step is repeated on a plurality of substrates at the same time.

The CVD apparatus is also equipped with a gas supply system 23 for introducing a gas, such as a passivation gas, to the reaction chamber 1. The gas supply system 23 comprises a flow controller 24 and a valve 25 to supply a first gas, and another flow controller 26 and a valve 27 to supply a second gas. The first gas may include either an inert gas or $N_2$ gas. An inert gas refers specifically to one selected from a group consisting of Ar, He, Xe, and Kr. The second gas is a gas which is easily adsorbed by the deposited film according to a first embodiment of the invention, or which functions as an oxidizing agent for the deposited film according to the second embodiment of the invention. Gases which can be easily adsorbed by the tungsten film include $NH_3$ gas or $Si_2Cl_2$ gas. The $NH_3$ gas or $Si_2Cl_2$ gas is preferably mixed with the first gas at a volume ratio of from 0.1 to 10% under standard state.

The gases which function as an oxidizing gas for tungsten (W) include air, oxygen, nitrogen monoxide, and nitrogen dioxide. For example, argon (Ar) controlled by the flow controller 24 to flow at a rate of 198 sccm may be mixed with ammonia ($NH_3$) gas controlled by a flow controller 26 to flow at a rate of 2 sccm. Thus, a mixture of argon and ammonia gases is introduced into the reaction chamber 1 at a total flow rate of 200 sccm. The mixture is an Ar—$NH_3$ gas containing 1% $NH_3$. The mixture is introduced preferably at a pressure of from 0.1 Torr to several hundreds of Torr.

The timing for introducing the mixture and the mixing ratio of the gas are controlled by a controller (not shown) which operates the valves 25, 27, and 28.

Figure 2:
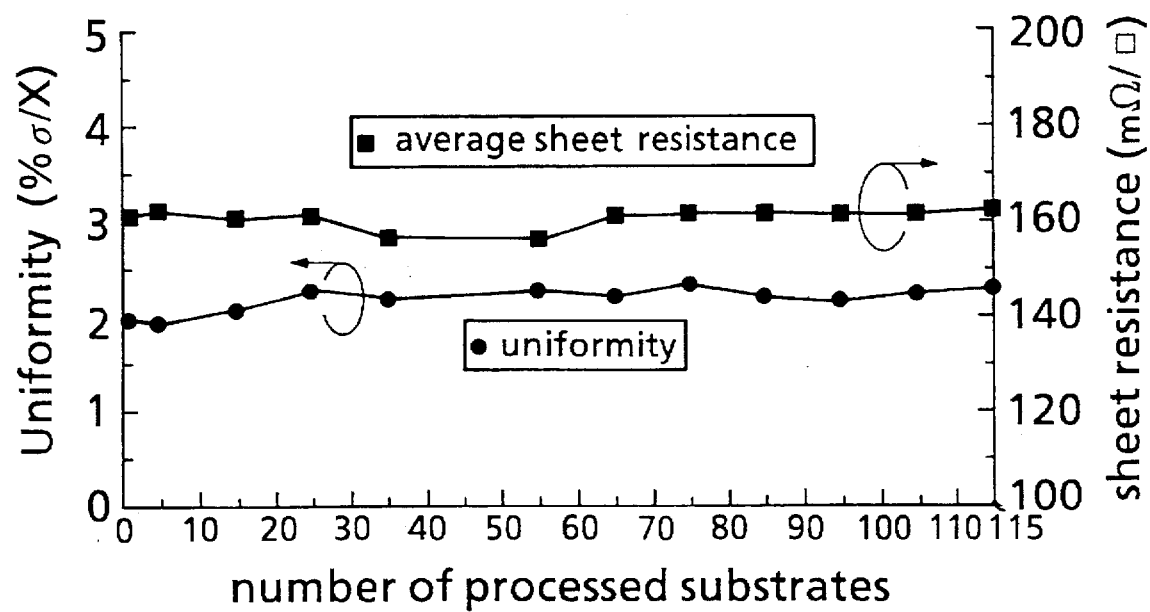
FIG. 2 is a graph of the changes in the deviation in sheet resistance or uniformity and the average of the sheet resistance for a thin film deposited by a continuous process for forming a thin film according to an embodiment of the present invention.
Figure 3:
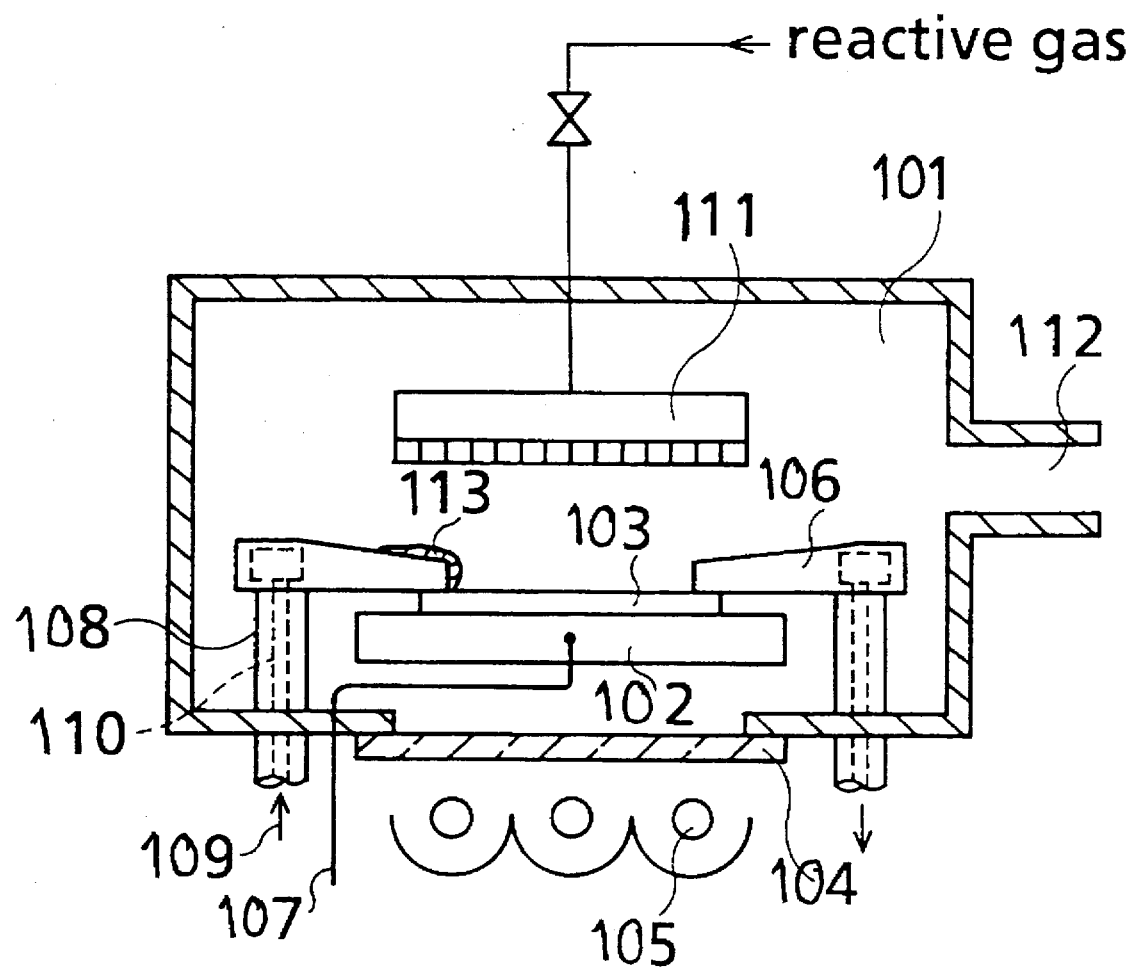
FIG. 3 is a schematically drawn, cross-sectional view, of the essential structure of a prior art apparatus for forming a thin film.
Figure 4:
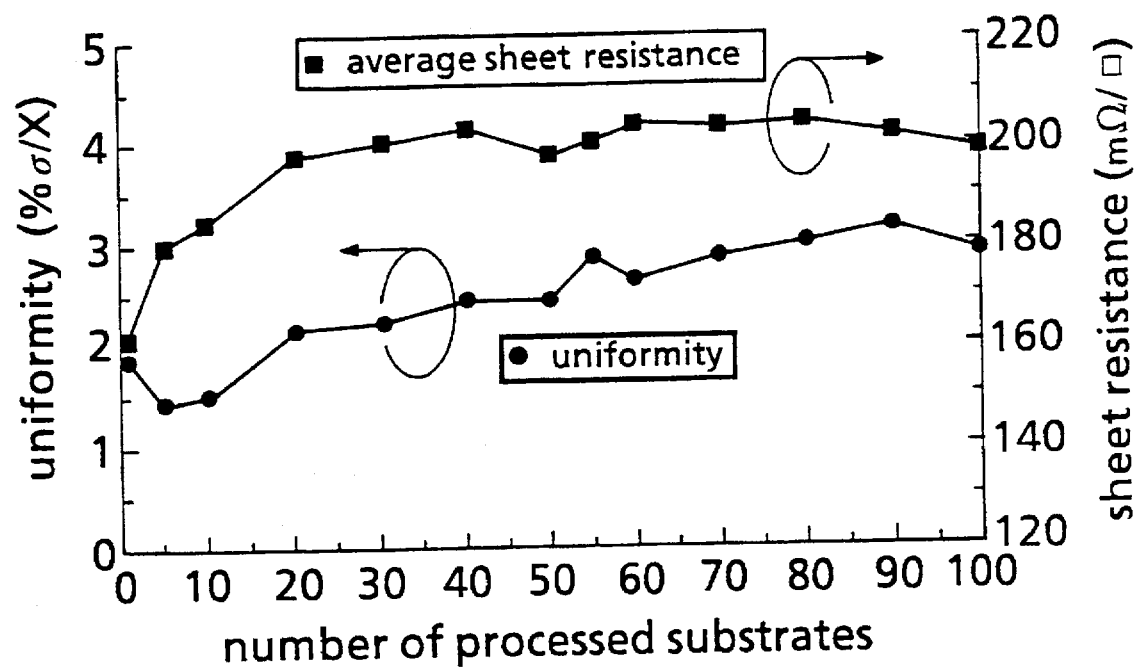
FIG. 4 is a graph of the changes in the deviation in sheet resistance or uniformity, and the average of the sheet resistance for a thin film deposited by a continuous process according to a prior art process for forming a thin film.
Figure 5:
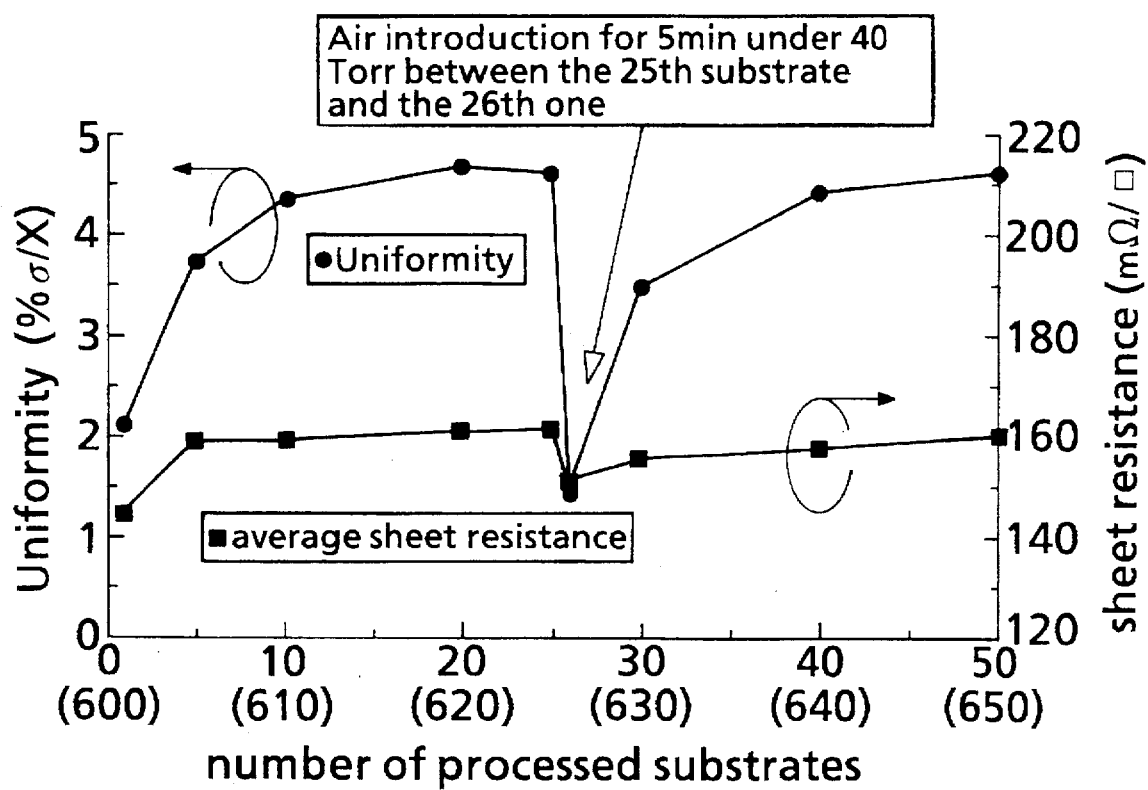
FIG. 5 is a graph of the deviation in sheet resistance, for a thin film which is ameliorated by introducing air during the film formation processes, according to a prior art process for forming a thin film.

FIG. 2 shows the average sheet resistance and the deviation in sheet resistance or uniformity for thin films formed by the process according to an embodiment of the present invention. More specifically, 100 or more substrates were subjected one after another to the film formation process of the present invention to form a thin film of tungsten on each of the substrates. The deviation in sheet resistance and the average of the sheet resistance were then measured on the deposited thin films.

The films of FIG. 2 were formed in two steps, namely a nuclei formation step and a film deposition step. The nuclei formation step was conducted in an atmosphere of $WF_6$ and $SiH_4$ gases at a ratio of 10/2 (sccm/sccm) at a total pressure of 1.5 Torr. $H_2$ gas at a flow rate of 1,000 sccm was then introduced for a duration of 10 sec. The film deposition step was performed by introducing $WF_6$ gas and $H_2$ gas at a ratio of 100/1,000 (sccm/sccm), at a total pressure of 40 Torr and for a duration of 120 sec. The tungsten film resulting from processing at the above conditions has a thickness of about 0.6 μm.

The passivation gas in the process of FIG. 2 was introduced between each successive substrate processing step. A mixture of Ar containing 1% $NH_3$ was introduced into the reaction chamber at a flow rate of 200 sccm, under a pressure of 6 Torr, for a duration of 20 sec. FIG. 2 shows that the deviation in sheet resistance is considerably lowered to a value of 2.4% or less, and that the reproducibility of the sheet resistance is improved to ±1.9% by the process of FIG. 2. The deviation in sheet resistance is lowered because the film deposition according to the process of the present invention can be performed without decreasing the film deposition rate at the outer periphery of the substrate. Thus, the reproducibility in film deposition is also improved as a result. The tungsten film in the present example adheres for a length of about 5 mm in the radial direction from the inner edge of the fixing jig 6.

Figure 6:
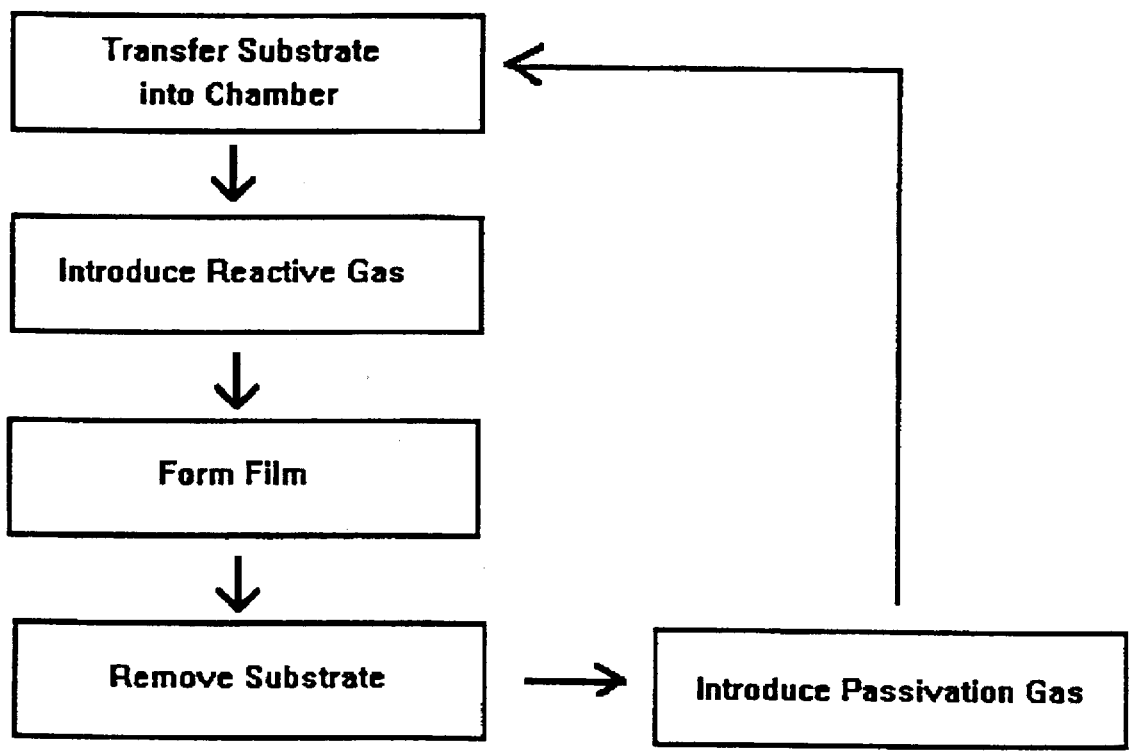
FIG. 6 is a flow chart of a first embodiment of the invention.
Figure 7:
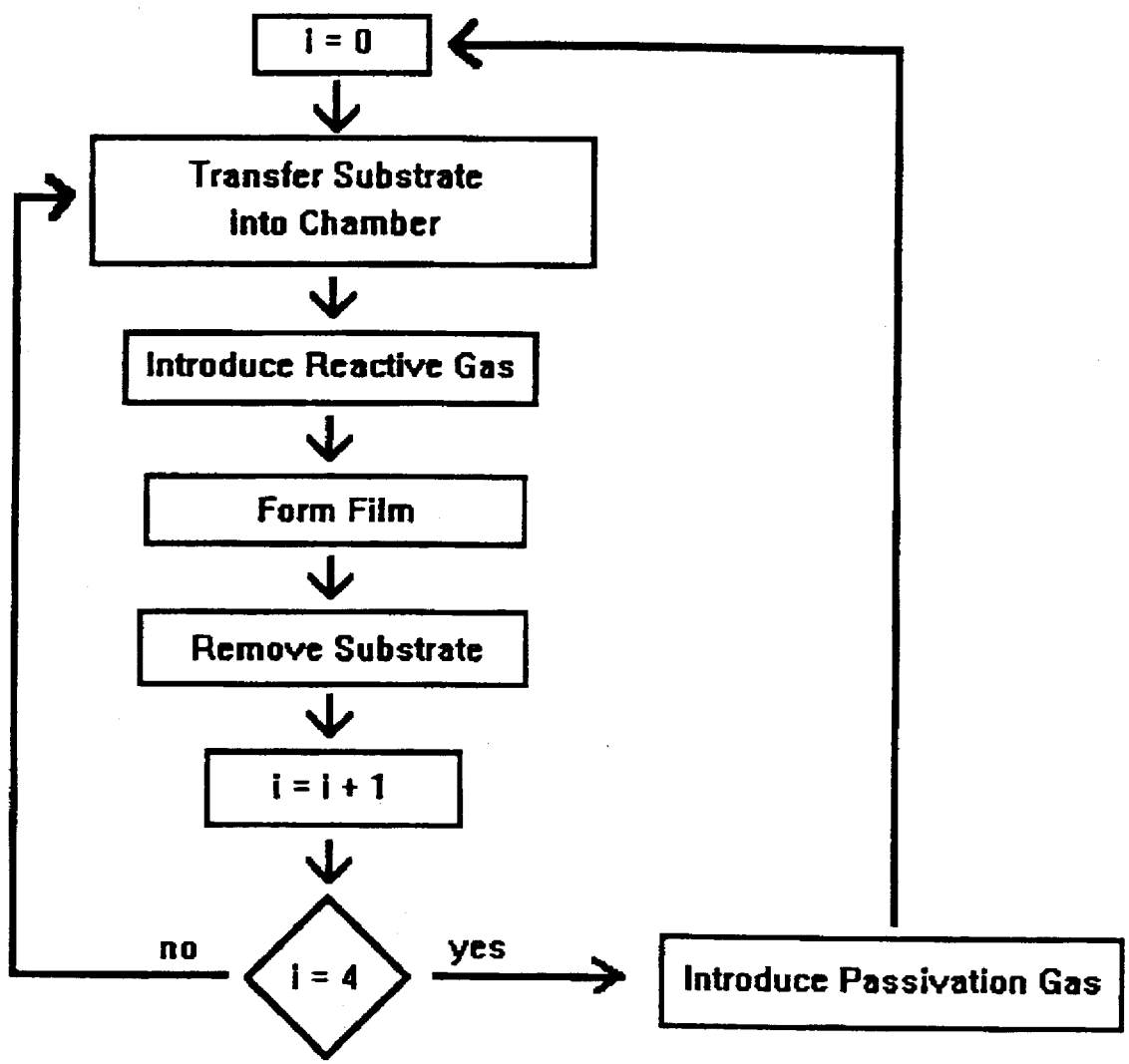
FIG. 7 is a flow chart of a second embodiment of the invention.
Figure 8:
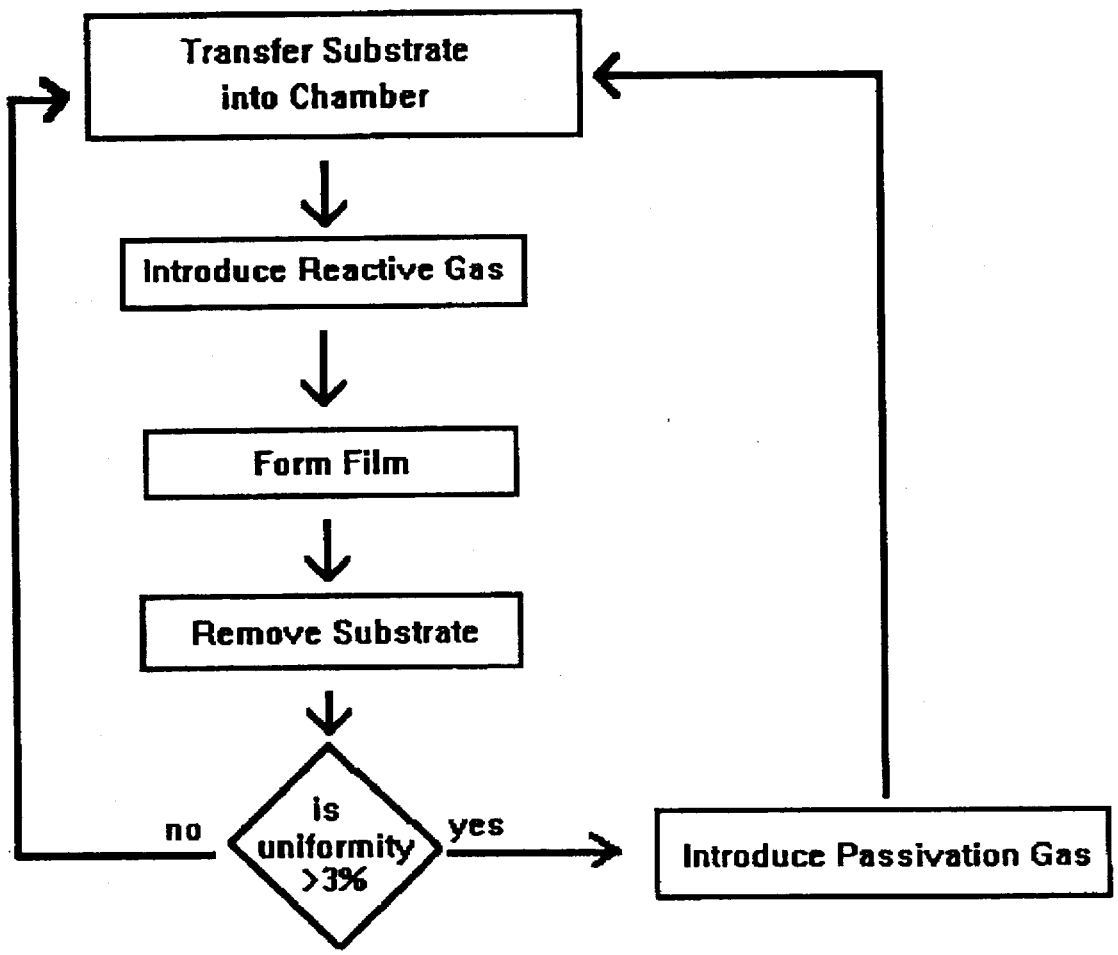
FIG. 8 is a flow chart of a third embodiment of the invention.

The three preferred embodiments of the invention are shown in the flow charts of FIGS. 6, 7 and 8. As shown in FIG. 6 the substrate processing step includes first transferring one or more substrates into the chamber, then introducing a reactive gas inside the chamber, forming a film on the substrate by a CVD reaction, and finally taking the processed substrate out of the chamber. The film formation step includes forming a nuclei and depositing a film on the nuclei. In the embodiment of FIG. 6 a passivation gas is introduced into the processing chamber after the processing of each substrate. FIG. 7 illustrates an alternative embodiment where a passivation gas is introduced after the processing of four substrates. The third embodiment shown in FIG. 8 includes a step of introducing passivation gas either shortly before or after the deviation in sheet resistance attains 3%.

In another embodiment, plasma discharge may be generated simultaneously with the introduction of the passivation gas inside the reaction chamber. The molecules of the passivation gas which are activated by the plasma discharge can further accelerate the passivation of the deposited film. The plasma discharge can be generated by connecting an rf power source to the electrodes that are set inside the reaction chamber. The means for generating a discharge are well known to those skilled in the art.

The present invention was described in detail with reference to particular examples in which a fixing jig is used as a peripheral member for fixing the substrate. However, the peripheral members which may be subject to unwanted film deposition, include a gas-introducing member placed in the vicinity of the substrate edge and other parts of the substrate support.

As described in the foregoing, the present invention comprises passivating the surface of the thin film which is adhered to the fixing jig and the like between the substrate processing steps to prevent additional film from adhering. Thus, a constant deviation in sheet resistance can be obtained even after repeated processing. By this process, a reproducible sheet resistance can be obtained to considerably improve the productivity.

The process for forming a thin film according to the present invention is also advantageous in that the adhesion of the tungsten film to the fixing jig is considerably reduced as compared to the prior art processes. Thus, the present invention reduces the periodic maintenance for replacing the jigs, and extends the tool life of the jig, to two or more times the usual tool life. More specifically, the jigs are now replaced after every 2,000 processed substrates, which is in clear contrast with the prior art process in which the jigs were changed after every 1,000 processed substrates in a single wafer processing system.

While the invention has been described in detail and with reference to specific embodiments thereof, it will be apparent to one skilled in the art that various changes and modifications of the invention can be made without departing from the spirit and scope thereof.

What is claimed is:

1. A process for forming a thin metal film, comprising:
performing a substrate processing step which includes transferring a substrate into a reaction chamber, forming a thin metal film on the substrate by a chemical vapor deposition reaction, and then removing the processed substrate from the reaction chamber;
repeating the substrate processing step for a number of substrates;
introducing an adsorbate passivation gas into the reaction chamber between substrate processing steps to passivate the surface of a thin film adhered to a peripheral member;
wherein the adsorbate passivation gas is a gas that is adsorbed by the surface of the thin film adhered to the peripheral member.

2. A process for forming a thin film as claimed in claim 1, wherein the passivation gas is introduced inside the reaction chamber before a deviation in sheet resistance of the deposited film reaches 3%.

3. A process for forming a thin film as claimed in claim 1, wherein the substrates are processed one after another, and the passivation gas is introduced after four substrates have been processed.

4. A process for forming a thin film as claimed in claim 1, wherein the passivation gas is introduced after each substrate processing step is completed.

5. A process for forming a thin film as claimed in claim 1, wherein the gas which is adsorbed by the surface is a mixture containing a first gas and a second gas, wherein the first gas is $N_2$ or another inert gas, and the second gas is from 0.1 to 10% of either $NH_3$ or $SiH_2Cl_2$.

6. A process for forming a thin film as claimed in claim 5, wherein said first gas is $N_2$.

7. A process for forming a thin film as claimed in claim 1, wherein the pressure of the passivation gas is controlled to fall in the range of from 0.1 Torr to several hundreds of Torr.

8. A process for forming a thin film as claimed in claim 1, wherein a plasma discharge is generated inside the reaction chamber simultaneously with the introduction of the passivation gas.

9. A process for forming a thin metal film as claimed in claim 1, wherein the thin metal film formed on the substrate is one of tungsten, tungsten silicide, copper, titanium nitride, and titanium.

10. A process for forming a thin metal film as claimed in claim 9, wherein the thin metal film formed on the substrate is one of tungsten and tungsten silicide.

* * * * *